(12) United States Patent
Kim (10) Patent No.: US 7,416,914 B2
(45) Date of Patent: Aug. 26, 2008

(54) METHOD OF FABRICATING CMOS IMAGE SENSOR

(75) Inventor: Yeong Sil Kim, Suwong (KR)

(73) Assignee: Dongbu Electronics Co., Ltd., Seoul (KR)

( * ) Notice: Subject to any disclaimer, the term of this patent is extended or adjusted under 35 U.S.C. 154(b) by 298 days.

(21) Appl. No.: 11/246,893

(22) Filed: Oct. 7, 2005

(65) Prior Publication Data

US 2006/0128051 A1 Jun. 15, 2006

(30) Foreign Application Priority Data

Dec. 14, 2004 (KR) ...................... 10-2004-0105564

(51) Int. Cl.
*H01L 21/00* (2006.01)
(52) U.S. Cl. .................. 438/69; 257/E27.133
(58) Field of Classification Search .................. 438/48, 438/60, 65, 70, 69; 257/E27.133, E27.134, 257/E27.149, E27.15, E27.159, E25.032, 257/E27.13, E31.097, E31.121, E27.142, 257/59, 72
See application file for complete search history.

(56) References Cited

U.S. PATENT DOCUMENTS

| 6,168,966 | B1 | 1/2001 | Fan et al. | |
|---|---|---|---|---|
| 6,255,640 | B1 | 7/2001 | Endo et al. | |
| 6,643,386 | B1 * | 11/2003 | Foster | 382/100 |
| 6,674,470 | B1 | 1/2004 | Tanaka et al. | |
| 6,794,215 | B2 | 9/2004 | Park et al. | |
| 6,956,253 | B2 * | 10/2005 | Weng et al. | 257/232 |
| 6,964,916 | B2 * | 11/2005 | Kuo et al. | 438/462 |
| 6,974,715 | B2 | 12/2005 | Lee | |
| 7,115,853 | B2 | 10/2006 | Jiang et al. | |
| 7,169,633 | B2 * | 1/2007 | Huang et al. | 438/57 |
| 2002/0020845 | A1 | 2/2002 | Ogura et al. | |
| 2004/0129990 | A1 | 7/2004 | Lee | |
| 2004/0238908 | A1 * | 12/2004 | Hashimoto | 257/432 |

(Continued)

FOREIGN PATENT DOCUMENTS

JP 5-90550 4/1993

(Continued)

OTHER PUBLICATIONS

Yeong Sil Kim; Self-Aligned Image Sensor and Method for Fabricating the Same; U.S. Appl. No. 11/205,543, filed Aug. 18, 2005.

(Continued)

*Primary Examiner*—Thao P. Le
(74) *Attorney, Agent, or Firm*—Andrew D. Fortney (57) ABSTRACT

A method of fabricating a CMOS image sensor is disclosed that enhances device robustness. The method includes the steps of forming a metal pad on a pad area of a substrate, forming a planarizing layer on the substrate including the metal pad, removing a portion of the planarizing layer to open a surface of the metal pad, forming a protective layer over the substrate including the metal pad, coating a color filter resist layer on the protective layer and selectively exposing the color filter resist layer, coating a microlens resist layer on the color filter resist layer and selectively exposing the microlens resist layer, developing the exposed color filter and microlens resist layers, forming a pad opening by selectively removing the protective layer to open a surface of the metal, and reflowing the microlens pattern.

19 Claims, 7 Drawing Sheets

U.S. PATENT DOCUMENTS

| | | | |
|---|---|---|---|
| 2005/0090035 A1* | 4/2005 | Kim | 438/70 |
| 2005/0139752 A1 | 6/2005 | Min | |
| 2005/0269656 A1* | 12/2005 | Shian-Ching et al. | 257/440 |
| 2006/0011813 A1* | 1/2006 | Park et al. | 250/208.1 |
| 2006/0038209 A1* | 2/2006 | Hashimoto | 257/294 |
| 2006/0138485 A1* | 6/2006 | Jung | 257/292 |
| 2006/0138500 A1* | 6/2006 | Kim | 257/294 |
| 2006/0138578 A1* | 6/2006 | Lim | 257/432 |
| 2006/0148160 A1* | 7/2006 | Kim | 438/199 |
| 2006/0273361 A1 | 12/2006 | Tanaka et al. | |

FOREIGN PATENT DOCUMENTS

| | | |
|---|---|---|
| KR | 2002-0048707 | 8/2002 |

OTHER PUBLICATIONS

Yeon Sil Kim; CMOS Image Sensor and Method for Fabricating the Same; U.S. Appl. No. 11/225,637, filed Sep. 12, 2005.

Jun Hwang: Image Sensor and Manufacturing Method Thereof: Korean Patent Abstracts: Jun. 24, 2002: Publication No. KR 1020020048707 A; Korean Intellectual Property Office, Republic of Korea.

Hiromichi Seki; Manufacturing Method of Solid-State Image Pick-Up Device: Patent Abstracts of Japan; Apr. 9, 1993; Publication No. JP 05-090550; Japanese Intellectual Property Office, Japan.

* cited by examiner

METHOD OF FABRICATING CMOS IMAGE SENSOR

This application claims the benefit of Korean Patent Application No. P2004-105564, filed on Dec. 14, 2004, which is hereby incorporated by reference in its entirety as if fully set forth herein.

BACKGROUND OF TEE INVENTION

1. Field of the Invention

The present invention relates to a method of fabricating a CMOS image sensor. Although the present invention is suitable for a wide scope of applications, it is particularly suitable for enhancing the robustness and/or performance of a device, particularly an imaging device.

2. Discussion of the Related Art

Generally, an image sensor is a semiconductor device that transforms an optical image into an electrical charge and/or signal. Semiconductor image sensors are mainly classified into a charge coupled device (hereinafter abbreviated CCD) image sensor and a complementary metal oxide semiconductor (hereinafter abbreviated CMOS) image sensor.

A CCD image sensor commonly consists of a pixel array of photodiodes (PD) arranged in a matrix form to that convert optical signals into electrical signals and/or charges. A plurality of vertical CCDs (VCCDs), provided between columns of photodiodes in the pixel array, transfer charges generated by the photodiodes in the vertical direction to a horizontal CCD (HCCD). The HCCD transfers the charges received from the VCCDs in a horizontal direction to a sense amplifier. The sense amplifier produces electrical signals representative of the charges received from the HCCD.

The above-configured CCD has a complicated driving mechanism, consumes considerable power, and generally involves a complicated fabrication process (e.g., due to a multi-step photolithography process). Further, because it is difficult to integrate with a control circuit, signal processing circuit, analog/digital converting circuit (A/D converter) and other circuitry on a CCD chip, the above-configured CCD is disadvantageous in reducing a size of product.

Recently, attention has been paid to CMOS image sensors as a next generation image sensor that overcome many disadvantages of the CCDs. Like CCD image sensors, CMOS image sensors comprise a pixel array of photodiodes or similar light transducers. However, unlike CCDs, CMOS image sensors incorporate one or more MOS transistors in each photodiode pixel. A control circuit selectively switches the transistors in each pixel to transfer desired photodiode signals to signal processing circuitry. A control circuit, signal processing circuit and other circuitry are commonly integrated onto a CMOS image sensor as peripheral circuits. CMOS image sensors produce images by sequentially detecting electrical signals generated by each unit pixel according to a switching method accomplished in part by configuring a photodiode and MOS transistor(s) within the unit pixel.

The CMOS image sensor, fabricated using CMOS fabrication technology, provides advantages including low power consumption and a relatively simple fabrication process involving a small number of photolithography process steps.

Further, because CMOS image sensors can be integrated with control circuitry, signal processing circuitry, an analog/digital converter and other circuitry on a CMOS sensor chip, CMOS image sensors facilitate product miniaturization.

Hence, in view of their relatively simple fabrication, integration, and low power operation, CMOS image sensors are widely used for various applications, including digital still cameras, digital video cameras and the like.

CMOS image sensors are classified into several types (e.g., 3T type, 4T type, 5T type and the like) according to the number of transistors in each unit pixel. The 3T type CMOS image sensor consists of one photodiode and three transistors. The 4T type CMOS image sensor consists of one photodiode and four transistors. An equivalent circuit and layout of a unit pixel of the 3T type CMOS image sensor are explained with reference to FIGS. 1-3E.

Figure 1:
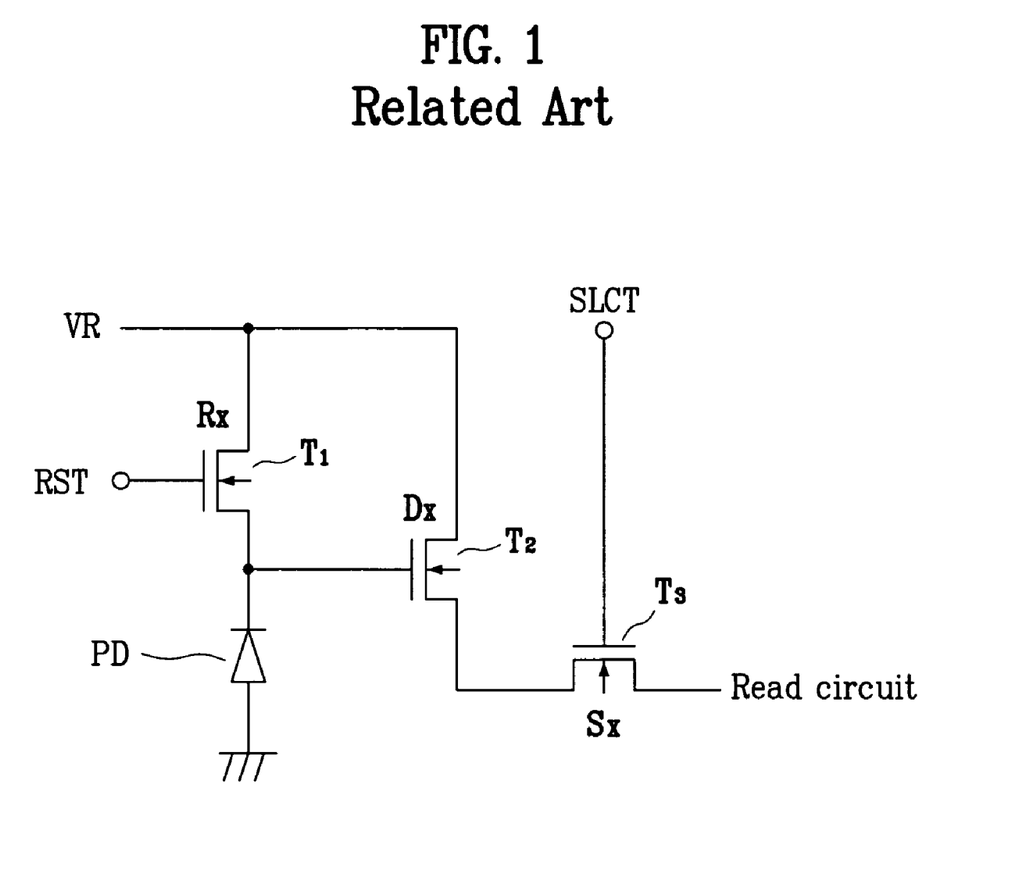
FIG. 1 is a diagram of an equivalent circuit of a general 3T type CMOS image sensor.
Figure 2:
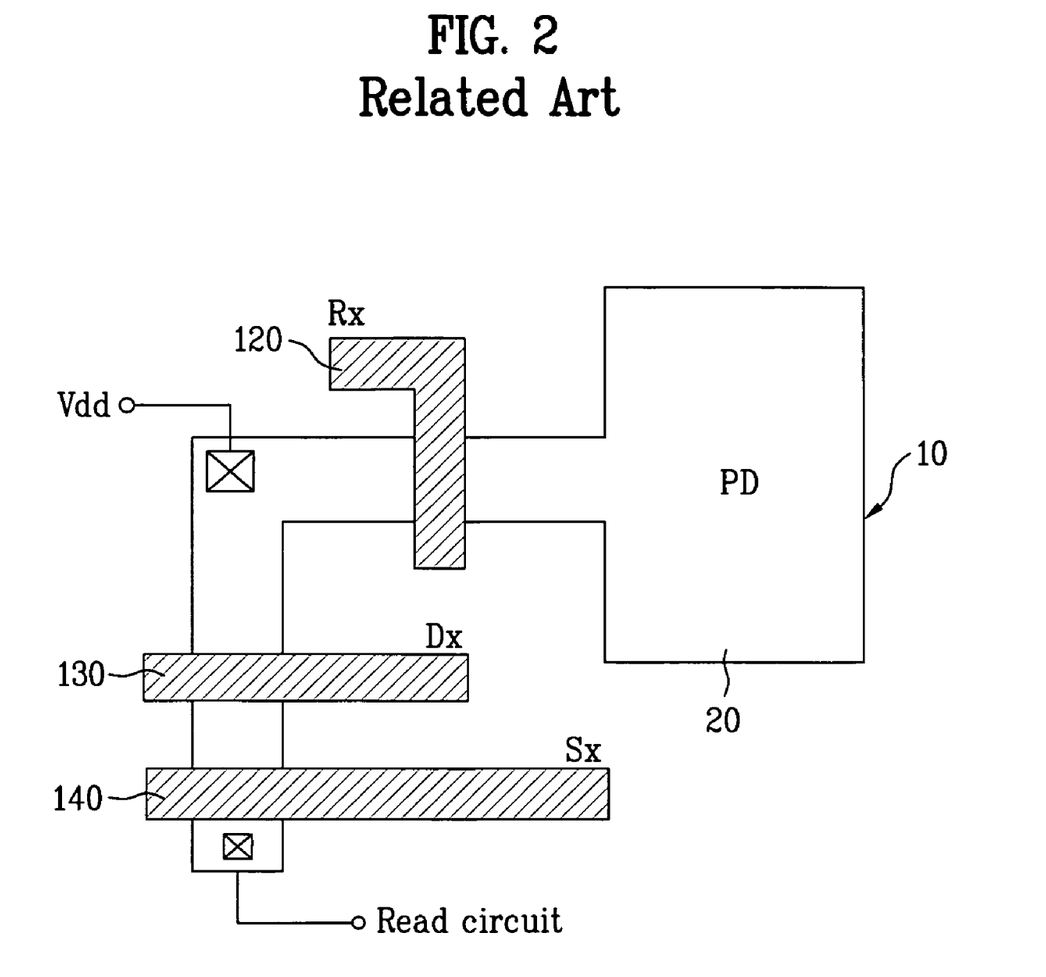
FIG. 2 is a layout of a unit pixel of a general 3T type CMOS image sensor.

FIG. 1 illustrates an equivalent circuit of a general 3T type CMOS image sensor. FIG. 2 illustrates a layout of a unit pixel of a general 3T type CMOS image sensor. FIGS. 3A to 3E illustrate cross-sectional diagrams of the process of fabricating a CMOS image sensor according to related art.

Referring to FIG. 1, a general 3T type CMOS image sensor consists of one photodiode PD and three NMOS transistors T1, T2, and T3. The cathode of the photodiode PD is connected to the drain of the first NMOS transistor T1 and the gate of the second NMOS transistor T2.

Sources of the first and second NMOS transistors T1 and T2 are connected to a power line that supplies a reference voltage VR. The gate of the first NMOS transistor T1 is connected to a reset line that supplies a reset signal RST.

The source of the third NMOS transistor T3 is connected to the drain of the second NMOS transistor. The drain of the third NMOS transistor T3 is connected to a read circuit (not shown in the drawing) via a signal line. The gate of the third NMOS transistor is connected to a column selection line that supplies a selection signal SLCT.

In accordance with their functions, the first to third NMOS transistors T1, T2, and T3 are referred to as reset, drive and selection transistors Rx, Dx and Sx, respectively.

Referring to FIG. 2, in a unit pixel of a general 3T type CMOS image sensor, an active area 10 is defined. One photodiode 20 is formed on a relatively wide part of the active area 10. Gate electrodes 120, 130 and 140 of the three transistors Rx, Dx, Sx are formed to overlap with remaining portions of the active area 10. Namely, the reset, drive and selection transistors Rx, Dx and Sx are configured with the gate electrodes 120, 130 and 140, respectively.

Impurity ions are implanted into the active area 10, except for the portion of the active area 10 overlapped by the transistor gate electrodes 120, 130, 140, to form photodiode area PD and source/drain regions of the transistors Rx, Dx, Sx, respectively.

Power voltage terminal Vdd is connected to the source/drain regions between the reset and drive transistors Rx and Dx. One source/drain region of the select transistor Sx is connected to the read circuit (not shown in the drawing).

Each of the gate electrodes 120, 130 and 140 is connected to a corresponding signal line (not shown in the drawing). A pad is provided for each signal line to be connected to an external drive circuit (not shown).

A process of forming the signal lines having the pads and processes carried out after completion of the signal line are explained as follows.

FIGS. 3A to 3E are cross-sectional diagrams for explaining a process of fabricating a CMOS image sensor according to a related art.

Figure 3A:
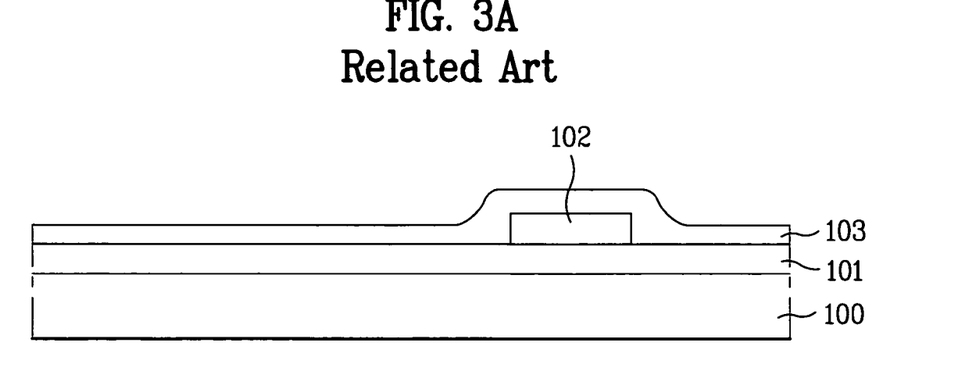
FIGS. 3A to 3E are cross-sectional diagrams illustrating a process of fabricating a CMOS image sensor according to a related art.

Referring to FIG. 3A, an insulating layer (e.g. oxide layer) 101, such as a gate insulating layer and/or an insulating interlayer (e.g., an insulator layer between a gate layer and a metal layer, or alternatively, between adjacent layers of metal, in the CMOS image sensor device), is formed on a semiconductor substrate 100. A metal pad 102 is formed on the insulating layer 101 for each of one or more of the signal lines.

Metal pad 102 may be formed with the same material used to form the corresponding gate electrodes 120, 130 or 140 on the same layer. Alternatively, the metal pad 102 may be formed with a different material, such as Al (aluminum), which may connect to a gate electrode via a separate contact.

Corrosion resistance of the metal pad 102 (e.g., comprising Al) may be increased in a later process by surface treatment carried out on a surface of the metal pad 102 by, e.g., UV ozone treatment or solution synthesis. A protective layer 103 may be formed on the insulating layer 101 and the metal pad 102. The protective layer 103 may comprise an oxide or nitride (e.g., of silicon).

Figure 3B:
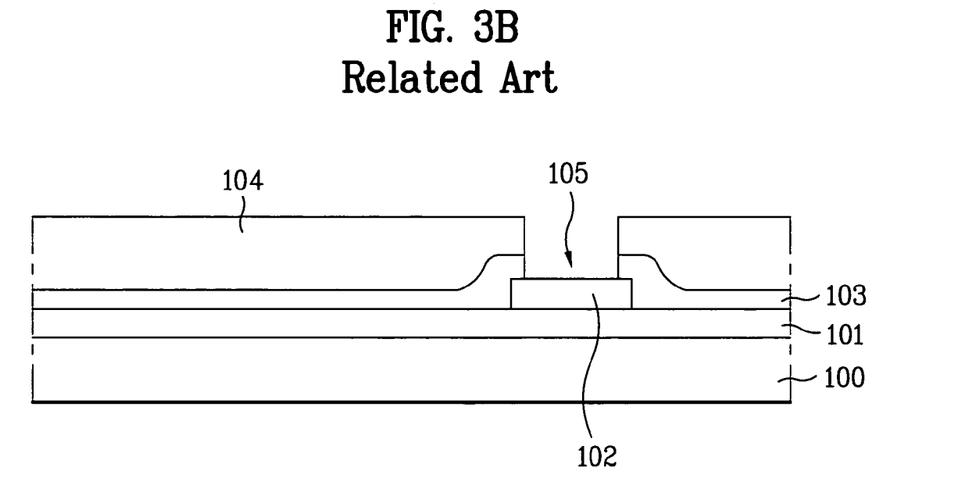

Referring to FIG. 3B, a photoresist layer 104 is coated on the protective layer 103. The photoresist layer 104 is then patterned by exposure and development to expose an upper part of the metal pad 102. The protective layer 103 is then selectively etched using the patterned photoresist layer 104 as a mask to form an opening 105 exposing the metal pad 102.

Figure 3C:
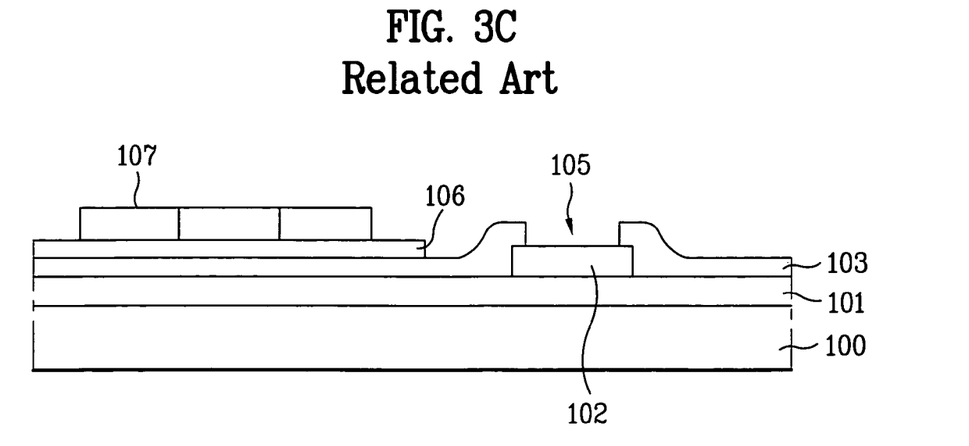

Referring to FIG. 3C, after the patterned photoresist layer 104 has been removed, a first planarizing layer 106 is formed on the protective layer 103. The first planarizing layer 106 is then patterned by photolithography so that the protective layer 106 does not overlap the metal pad 102 or, in many cases, a non-planar portion of protective layer 103.

A color filter layer 107 is then formed on the first planarizing layer 106 corresponding to each photodiode (not shown in the drawing). In this case, each color filter in the color filter layer 107 (which contains a plurality of color filters) is formed by coating a corresponding color resist and by carrying out photolithography using a separate mask for each color filter.

Figure 3D:
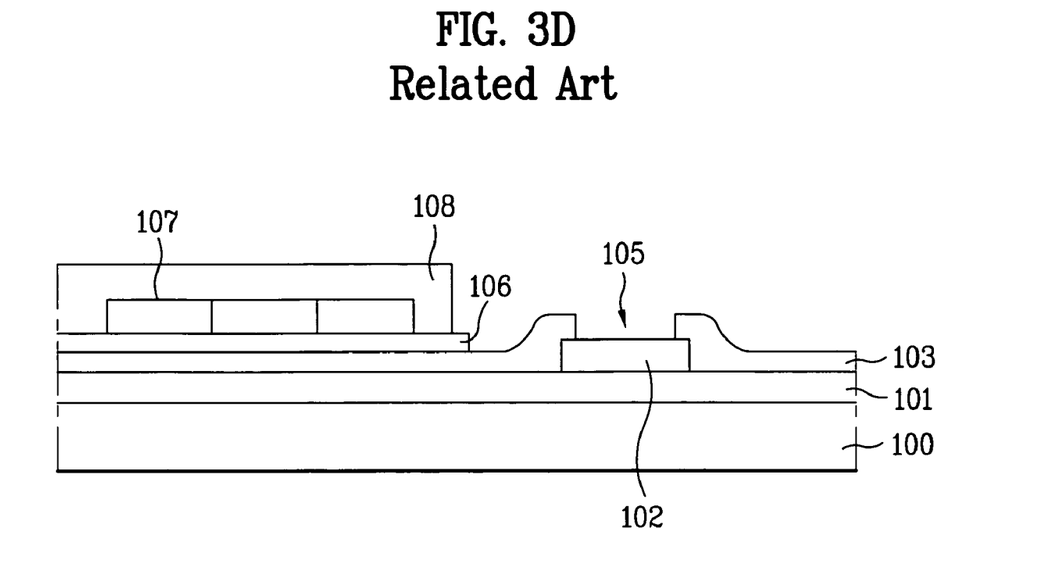

Referring to FIG. 3D, a second planarizing layer 108 is formed over the substrate including the color filter layer 107 and is then patterned by photolithography using a mask so that it does not overlap metal pad 102 or, in many cases, a non-planar portion of protective layer 103. Typically, second planarizing layer 108 does not contact protective layer 103.

Figure 3E:
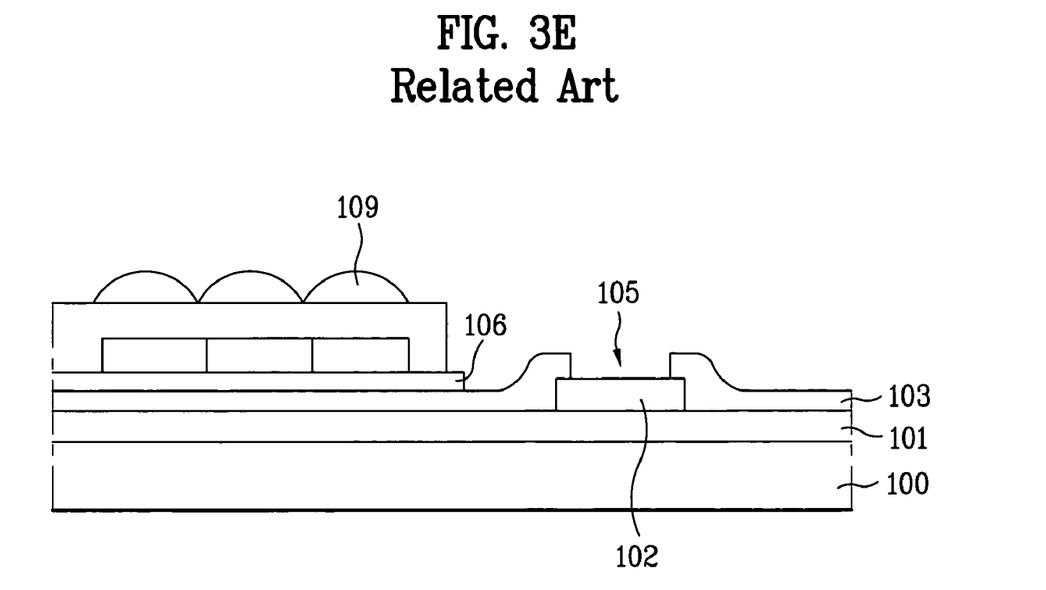

Referring to FIG. 3E, microlenses 109 are formed on the second planarizing layer 108 corresponding to the color filters in the color filter layer 107.

A probe test is carried out on the metal pad 102 of the CMOS image sensor to check a contact resistance. If the metal pad 102 passes the probe test, the metal pad 102 is electrically connected to an external drive circuit (not shown).

Thus, the color filter layer 107 includes red, green and blue color filters formed by a plurality of photolithography processes, and separately, a unique microlens 109 over each color filter in the color filter layer 107, formed by a further photolithography process. In this process, if an alignment between the microlenses 109 and the color filter layer 107 deviates from a predetermined range, an image sensor pixel will fail to produce an expected and/or appropriate color. Furthermore, since the microlenses 109 are formed by reflow of a microlens resist at 150~200° C., the microlenses 109 are sensitive to the temperature and thickness of the microlens resist.

These process variables (e.g., temperature and thickness of the microlens resist, photolithography alignment tolerances and variability) affect the alignment between the microlenses 109 and the color filters in the color filter layer 107. Misalignment reduces incident light throughput to the color filters and, subsequently, to the photodiodes.

Moreover, the open metal pad 102, which is exposed to photolithography development solution(s) through multistep photolithography processes, is vulnerable to chemical attack, which may result in failure during probe test, or which may generate metal fragments from the attacked metal pad 102. Metal fragments generated from the probe test may be transferred to the microlenses and may cut off or reflect light incident on the color filters and photodiodes, resulting in a pixel noise defect.

SUMMARY OF THE INVENTION

Accordingly, the present invention is directed to a method of fabricating a CMOS image sensor that substantially obviates one or more problems due to limitations and disadvantages of the related art.

An object of the present invention is to provide a method of fabricating a CMOS image sensor that enhances alignment between a microlens and a color filter layer by simultaneously forming both the color filter layer and the microlens and enhances device robustness and/or performance by preventing contamination of the metal pad.

Another object of the present invention is to provide a method of fabricating a CMOS image sensor that simplifies fabrication, reduces cost, and forms a self-aligned color filter lens by forming a color filter lens pattern with a film additionally deposited on a planarizing layer to minimize throughput reduction from misalignment between the microlens and the floor filter.

Additional advantages, objects, and features of the invention are set forth in part in the description which follows and in part will become apparent to those having ordinary skill in the art upon examination of the following or may be learned from practice of the invention. The objectives and other advantages of the invention may be realized and attained from the entirety or any portion of the disclosure, including any structure particularly pointed out in the written description and claims hereof as well as the appended drawings.

To achieve these objects and other advantages and in accordance with the purpose of the invention, as embodied and broadly described herein, a method of fabricating a CMOS image sensor may include the steps of forming a metal pad on a pad area of a substrate, forming a planarizing layer on the substrate and the metal pad, removing the planarizing layer sufficiently to open a surface of the metal pad, forming a protective layer over the substrate and the metal pad, coating a color filter resist layer on the protective layer and selectively exposing the color filter resist layer, coating a microlens resist layer on the color filter resist layer and selectively exposing the microlens resist layer, developing the exposed color filter and microlens resist layers (e.g., to form a color filter layer and a microlens pattern in the active area), forming a pad opening by selectively removing a portion of the protective layer over the metal pad (e.g., using the microlens pattern and the color filter layer as a mask), and forming a microlens by reflowing the microlens pattern.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or similar elements.

FIGS. 4A to 4G are cross-sectional diagrams illustrating a process of fabricating a CMOS image sensor according to the present invention.

Figure 4A:
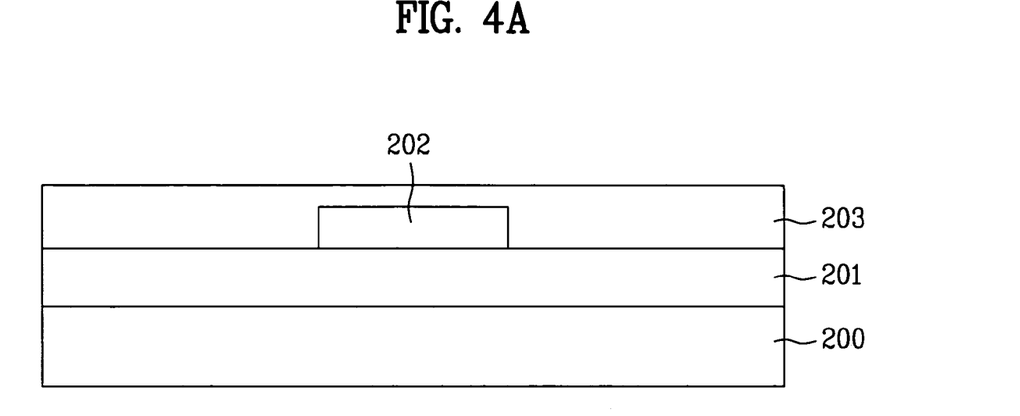
FIGS. 4A to 4G are cross-sectional diagrams illustrating a process of fabricating a CMOS image sensor according to the present invention.

Referring to FIG. 4A, an insulating layer 201, such as a gate insulating layer and an insulating interlayer, is formed on a semiconductor substrate 200 having image sensor elements (not shown), e.g., photodiodes or other light transducers, already formed therein. A metal pad 202 is formed on the insulating layer 201 for each signal line.

In some embodiments, metal pad 202 may be formed from the same material used to form the signal lines corresponding to or communicating with gate electrodes 120, 130 or 140 on the same layer, as explained in the foregoing description. In other embodiments, the metal pad 102 may comprise or be formed from a different material, such as Al (aluminum), via a separate contact.

Subsequently, a planarizing layer 203 is formed, e.g., by CVD (chemical vapor deposition), over the semiconductor substrate 200, including the metal pad 202. The surface of the planarizing layer 203 is then planarized by, for example, CMP (chemical mechanical polishing).

Planarization is carried out to remove variations in coating thickness that lead to performance problems, e.g., discoloration brought about by the varying topography of a lower layer subjected to various resist coating processes. The thickness variations induce intensity variations in transmitted radiation to bring about unpredictable photodiode responses, thereby degrading product performance. Hence, product robustness may be degraded.

Figure 4B:
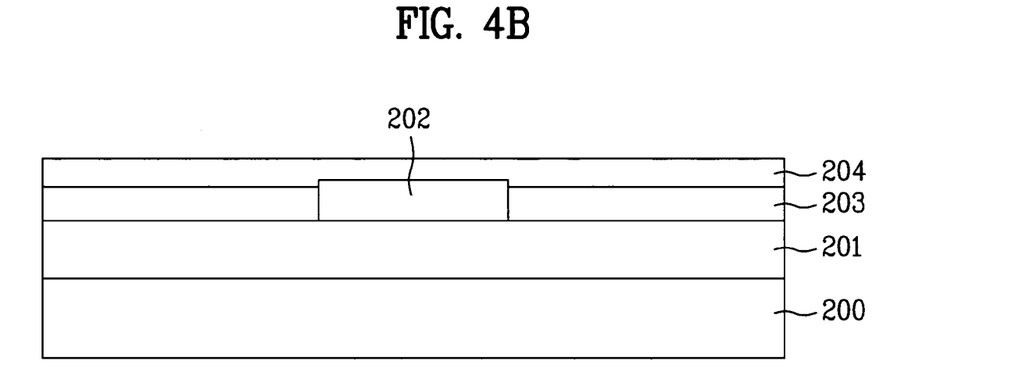

Referring to FIG. 4B, a blanket etch is carried out (e.g., a conventional etchback process) on the planarizing layer 203 to expose a surface of the metal pad 202. Alternatively, planarizing layer 203 may be planarized by CMP until the metal pad 202 is exposed. Thereafter, an oxide layer 204 is formed on the protection layer 202, generally by blanket deposition (e.g., CVD, such as PE-CVD or HDP-CVD, from silicon sources such as TEOS or silane ($SiH_4$), and oxygen sources such as ozone ($O_3$) or oxygen ($O_2$), as is known in the art.

Subsequently, a protective layer 204 is formed over the semiconductor substrate 200, including the metal pad 202. In some embodiments, the protective layer 204 comprises or is formed of oxide (e.g., USG, BPSG or FSG) or nitride (e.g. $Si_3N_4$) by, for example, blanket deposition (e.g., CVD, such as PE-CVD or HDP-CVD).

In some embodiments, the protective layer 204 has a thickness of 300~800 Å to prevent, avoid or minimize damage to the metal pad 202 that would otherwise be exposed to development solution during subsequent photolithography processes. In some embodiments, protective layer 204 may have a thickness of 300~500 Å. In some embodiments, a CMP process may be carried out on protective layer 204 to planarize its upper surface.

Figure 4C:
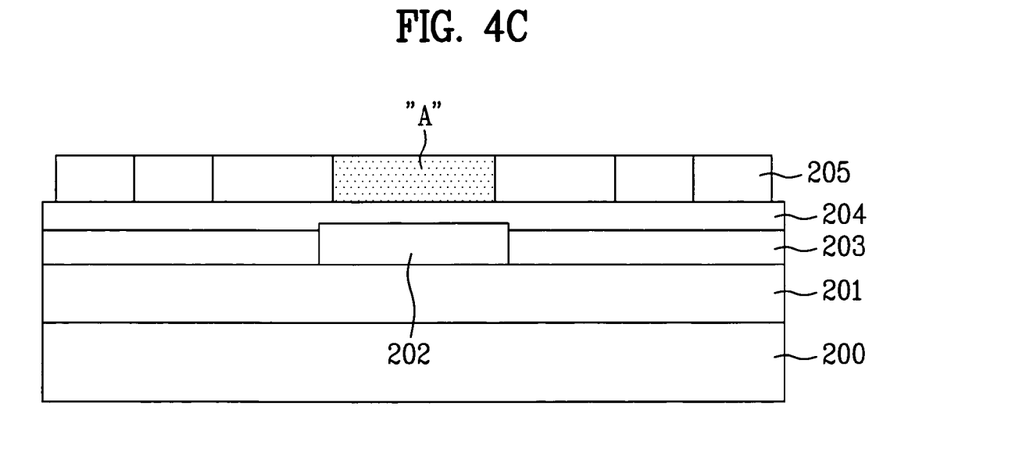

Referring to FIG. 4C, a color filter layer 205 is formed on the protective layer 204. In some embodiments (e.g., where the protective layer 204 comprises, e.g., a nitride or doped oxide having a lower etch rate), this may be accomplished by forming a sacrificial oxide layer (not shown) on the protection layer 204, generally by blanket deposition (e.g., CVD, such as PE-CVD or HDP-CVD, from silicon sources such as TEOS or silane ($SiH_4$), and oxygen sources such as ozone ($O_3$) or oxygen ($O_2$), as is known in the art. In most cases, however, the individual color filters (e.g., red, green and blue, or yellow, magenta and cyan) are formed one at a time, directly on the protective layer 204, without the use of a sacrificial layer, as is shown in FIG. 4C.

FIG. 4C illustrates a stage in processing where the color filter resist layer 205 is incomplete. The portion of color filter layer 205 identified as "A" identifies a portion of color filter resist layer 205 that will ultimately be removed, but which has not yet been developed. In general, a color filter resist layer 205 is coated on the protective layer 204. Selective exposure to light in a conventional photolithographic process is carried out on the color filter resist layer 205. The not developing color filter resist layer 205 at this time include, but are not limited to, simplifying fabrication, avoiding the need for an additional planarizing layer, reducing cost, forming self-aligned color filters and microlenses, enabling simultaneous formation of both the color filter layer and the microlens, and further enhancing device performance by preventing contamination of metal pad 202. However, not all of these purposes may be satisfied in every embodiment. In this case, due to the nature of the resist layer 205, part A corresponds to an exposed area.

Meanwhile, portions of the color filter resist layer 205 corresponding to one of red, green and blue colors, is the color filter formed last. In the present invention, development is not carried out after exposure. This may also reduce, inhibit or prevent discoloration due to an uneven topography of the color filter while forming a microlens.

However, when the sacrificial oxide layer is used, it is formed on the protection layer 204 and patterned prior to deposition of the first color filter resist material so that it remains in areas other than those where the color filters are to be formed. The use of a sacrificial oxide layer to form a color filter layer in a CIS device is described in greater detail in U.S. application Ser. No. 11/205,543, filed on Aug. 16, 2005, the relevant portions of which are incorporated herein by reference.

For example, in either process for forming the color filter layer 205, a resist for a blue color filter may be coated or deposited (on either planarization layer 204 or the patterned sacrificial oxide layer), and an exposure and development process (and optionally, a planarization process) may be performed on the blue color filter resist to form a blue resist pattern (identified as a segment of color filter resist layer 205). A resist for a red color filter may then be coated and patterned to form a red resist pattern (identified as a segment of color filter resist layer 205), and finally, a resist for a green color filter may be coated and patterned in the remaining portion(s) of the color filter layer, thereby forming a temporarily incomplete green resist pattern (identified as a segment of color filter resist layer 205).

Thus, the resists for blue, red and green color filters are formed on the exposed portions of the protection layer 204 with the final processing steps for the final color filter being delayed, leaving the color filter resist layer 205 temporarily incomplete. In embodiments using the patterned sacrificial oxide layer, removal thereof is also delayed until later in the process.

Color filters within color filter resist layer 205 are formed in correspondence or alignment with image sensors, such as photodiodes (not shown, but generally located in an underlying portion of substrate 200), that are configured to receive illumination radiating (or transmitted) through the color filters in the color filter layer 205.

The order of color filters and the colors and color schemes themselves may vary from one embodiment to the next. Whatever the order or color, or the color scheme, one or more final processes devoted to completion of the color filter resist layer 205 are delayed. In some embodiments, this may mean that the patterned oxide layer may not be removed in part or in its entirety. In others, it may mean that the final color is exposed but not developed. In still others it may mean that multiple steps for layer completion are delayed.

Figure 4D:
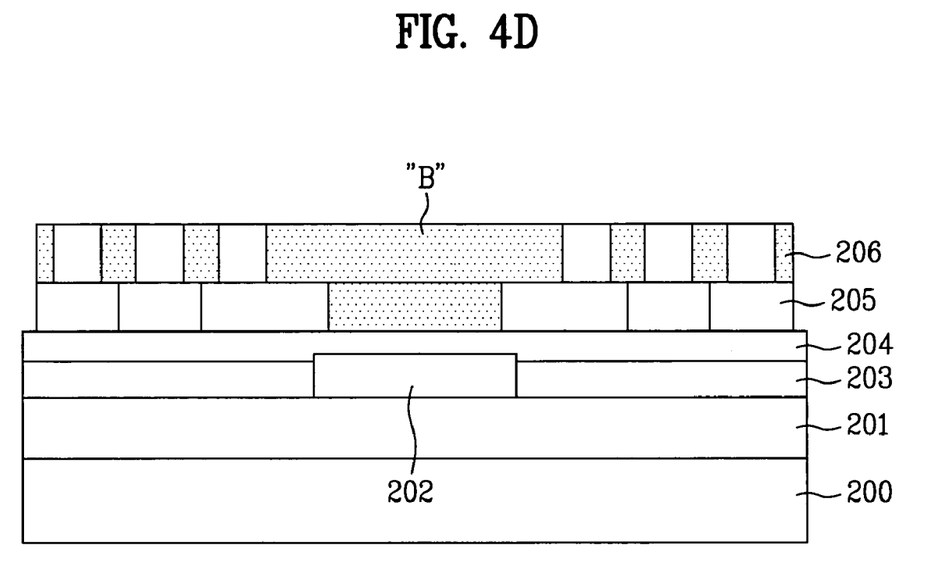

Referring to FIG. 4D, a microlens resist layer 206 is coated over the semiconductor substrate 200, including the selectively exposed color filter resist layer 205. Exposure is then selectively carried out (e.g., by irradiation of the resist layer 206 through a conventional photolithographic mask) on the microlens resist layer 206. The hatched portions of microlens resist layer 206 identified as "B" indicate exposed portions to be removed during development. Layers 205 and 206 are then completed simultaneously to form layers 207 and 208, respectively. In this case, due to the nature of resist layer 206, part B corresponds to an exposed area.

Figure 4E:
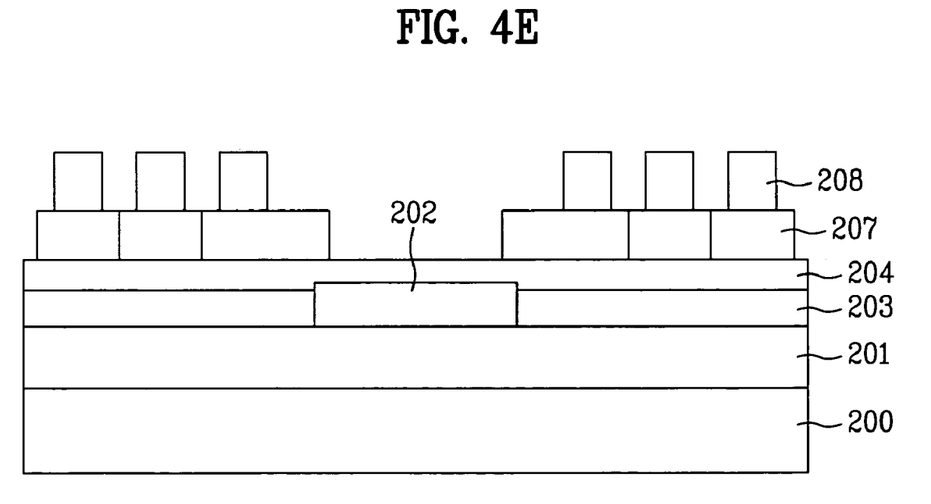

Referring to the embodiment illustrated in FIG. 4E, by developing the exposed color filter resist layer 205 and the exposed microlens resist layer 206, a color filter layer 207 and a microlens pattern 208 are formed. In some embodiments, portions "A" and "B" are removed by the same process while in other embodiments it may require multiple processes, for example, depending on the materials removed by a first developer and/o the materials that must be removed by a second developer.

Figure 4F:
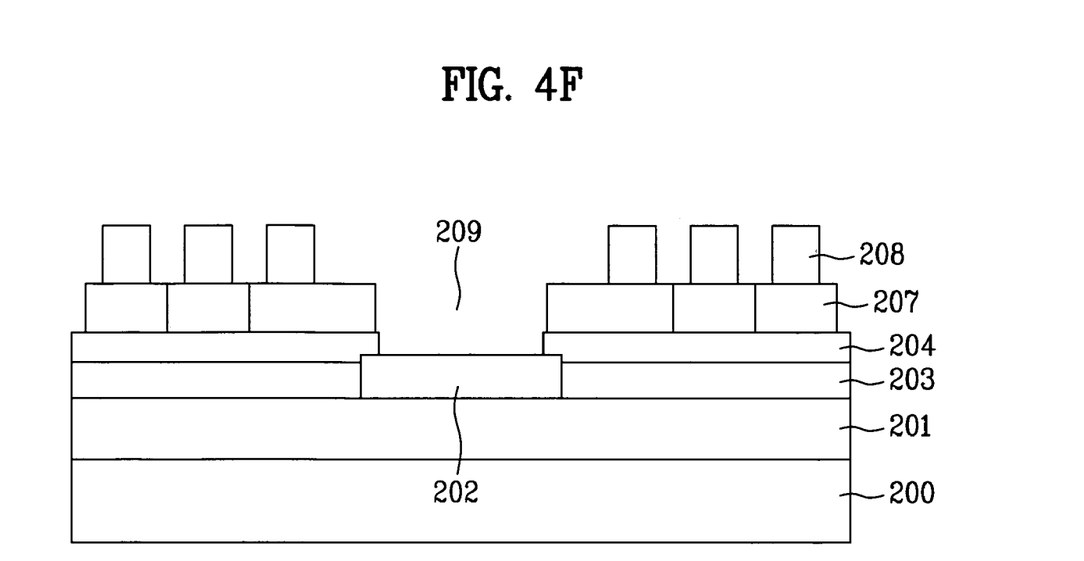

Referring to FIG. 4F, a pad opening 209 is formed by selectively removing the protective layer 204 by known processes (e.g., development) to expose a surface of the metal pad 202 using the microlens pattern 208 and the color filter layer 207 as a mask.

Figure 4G:
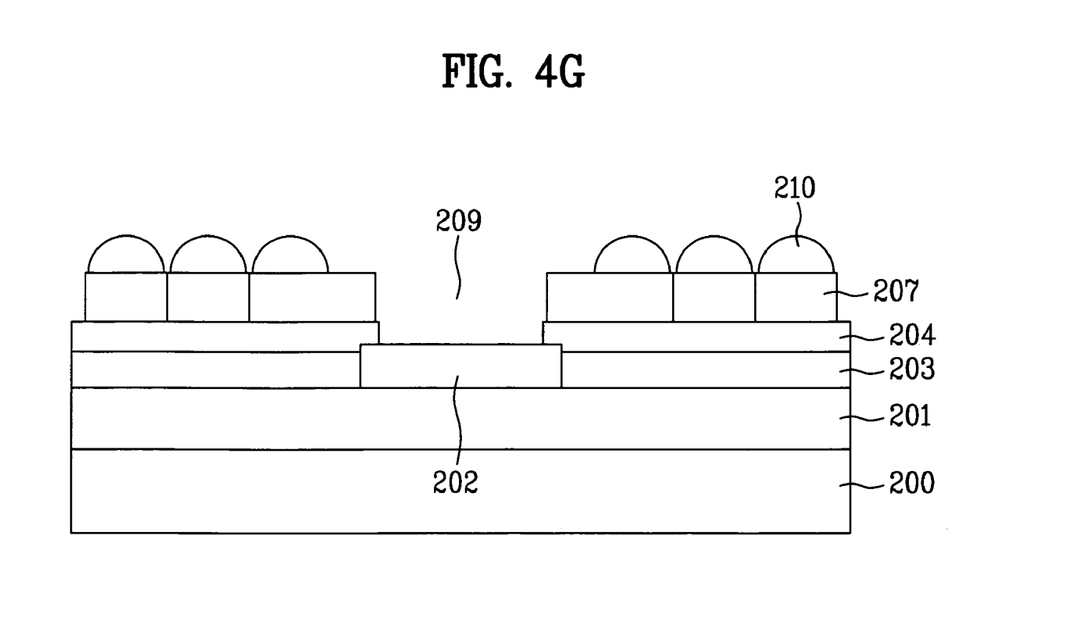

Referring to FIG. 4G, reflow is carried out on the microlens pattern 208 at a prescribed temperature to form a hemispherical microlens pattern 210. In some embodiments, the prescribed temperature is between 100 and 250 degrees, while in others it is between 150 and 200 degrees. In practice, the actual reflow temperature or temperature range may depend upon a number of variables known to those of skill in the art. In some embodiments, the micro-lens material may comprise a same resist material used in color filter resist layer 205; in others, the micro-lens material will be different from one or more of the color filter resists.

Accordingly, the present invention provides numerous effects or advantages that may be realized depending on the particular embodiment.

First of all, the present invention need not form an additional planarizing layer between the color filter and the microlens, thereby reducing or preventing potential misalignment between the color filter and the microlens.

Secondly, since the protective layer is provided on the metal pad during various exposure and development steps, the present invention may reduce or prevent degradation of the metal pad and potential contamination from chemical attack, and enhance device robustness.

In some embodiments misalignment between the color filter and the microlens may be diminished by avoiding intervening layer(s). In some embodiments, fabrication steps may be simplified by eliminating a planarization layer between the color filter and microlenses. In other embodiments, fabrication steps are simplified because multiple device layers may be completed during the same step or series of steps. In some embodiments, the self-aligned image sensor has improved light-transmitting efficiency because there is no intervening planarization layer (which, under typical operating conditions, may reflect some light back towards the upper surface of a conventional CMOS image sensor). In some embodiments, performance and/or yield will be enhanced at least in part because of the reduced number of processing steps and/or reduced possibility for misalignment.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A method of fabricating a CMOS image sensor, comprising the steps of:
    forming a metal pad on a pad area of a substrate divided into an active area and the pad area;
    forming a planarizing layer on the substrate including the metal pad;
    exposing a surface of the metal pad by selectively removing the planarizing layer;
    forming a protective layer over the substrate including the exposed portion of the metal pad;
    coating a color filter resist layer on the protective layer;
    selectively exposing a portion of the color filter resist layer above the metal pad;
    coating a microlens resist layer on the color filter resist layer, including the selectively exposed portion;
    forming a microlens pattern on the color filter layer, including the selectively exposed portion, by selectively exposing portions of the microlens resist layer above the metal pad and each interface between adjacent color filters;
    developing the microlens resist layer and color filter resist layer to remove the selectively exposed portions of the microlens resist layer and selectively exposed portion of the color filter resist layer;
    forming a pad opening by selectively removing the protective layer to expose a prescribed surface of the metal pad using the microlens pattern and/or the developed color filter resist layer as a mask; and
    reflowing the microlens pattern.

2. The method of claim 1, wherein the protective layer comprises an oxide or a nitride.

3. The method of claim 1, wherein the protective layer has a thickness of 300~500 Å.

4. The method of claim 1, further comprising the step of planarizing the planarizing layer.

5. The method of claim 1, wherein removing the planarizing layer comprises blanket etching the planarizing layer.

6. The method of claim 1, comprising developing the microlens resist layer and the color filter resist layer after forming the microlens pattern.

7. The method of claim 1, comprising simultaneously developing the microlens resist layer and the color filter resist layer.

8. The method of claim 1, comprising developing the microlens resist layer and the color filter resist layer with a first developer.

9. A method of fabricating an image sensor, comprising the steps of:
   forming a selectively exposed color filter resist layer on a protective layer in an active area of a substrate further containing a metal pad in a pad area;
   forming a selectively exposed microlens resist layer on the selectively exposed color filter resist layer, including selectively exposed portions of the color filter resist layer;
   after forming the selectively exposed microlens resist layer, developing the selectively exposed color filter resist layer and the selectively exposed microlens resist layer to remove the selectively exposed portions of the microlens resist layer and selectively exposed portions of the color filter resist layer to form a color filter layer and a microlens pattern in the active area; and
   forming a pad opening by removing a portion of the protective layer to expose the metal pad using the color filter layer and the microlens pattern as a mask.

10. The method of claim 9, further comprising forming the planarizing layer on the substrate and the metal pad.

11. The method of claim 10, further comprising removing a portion of the planarizing layer such that a surface of the metal pad is exposed.

12. The method of claim 11, further comprising forming a protective layer over the substrate and the metal pad.

13. The method of claim 9, further comprising reflowing the microlens pattern.

14. The method of claim 9, wherein selectively exposing the color filter resist layer comprises selectively exposing a portion of the color filter resist layer above the metal pad.

15. The method of claim 9, wherein selectively exposing the microlens resist layer comprises selectively exposing a portion of the microlens resist layer above the metal pad.

16. The method of claim 15, wherein selectively exposing the microlens resist layer further comprises selectively exposing portions of the microlens resist layer above an interface between adjacent color filters.

17. The meted of claim 9, comprising developing the color filter resist layer after forming the microlens pattern.

18. The method of claim 9, comprising simultaneously developing the selectively exposed microlens resist layer and the selectively exposed color filter resist layer.

19. The method of claim 9, comprising developing both of the microlens resist layer and the color filter resist layer with a first developer.

* * * * *